(12) United States Patent
Ketterer

(10) Patent No.: US 9,673,599 B2
(45) Date of Patent: Jun. 6, 2017

(54) BOX COMPRISING A HINGE DEVICE

(71) Applicant: Eaton Protection Systems IP GmbH & Co. KG, Schönefeld (DE)

(72) Inventor: Michael Ketterer, Soest (DE)

(73) Assignee: EATON PROTECTION SYSTEMS IP GMBH & CO. KG, Schonefeld (DE)

( * ) Notice: Subject to any disclaimer, the term of this patent is extended or adjusted under 35 U.S.C. 154(b) by 17 days.

(21) Appl. No.: 14/650,252

(22) PCT Filed: Dec. 4, 2013

(86) PCT No.: PCT/EP2013/003665
§ 371 (c)(1),
(2) Date: Jun. 5, 2015

(87) PCT Pub. No.: WO2014/086488
PCT Pub. Date: Jun. 12, 2014

(65) Prior Publication Data
US 2015/0318678 A1    Nov. 5, 2015

(30) Foreign Application Priority Data

Dec. 6, 2012   (DE) .......................... 10 2012 023 991

(51) Int. Cl.
*H02G 3/08* (2006.01)
*H02G 3/14* (2006.01)
(Continued)

(52) U.S. Cl.
CPC ................ *H02G 3/14* (2013.01); *E05D 5/02* (2013.01); *E05D 7/043* (2013.01); *H05K 5/0226* (2013.01);
(Continued)

(58) Field of Classification Search
CPC .. H02G 3/14; E05D 5/02; E05D 7/043; E05D 3/022; H05K 5/0226; E05Y 2900/602;
(Continued)

(56) References Cited

U.S. PATENT DOCUMENTS

2009/0308863 A1* 12/2009 Naumann ................ H02G 3/14
                                                            220/3.7

FOREIGN PATENT DOCUMENTS

CH         417727    * 7/1966  ............... H02B 1/40
DE         546291      3/1932
(Continued)

OTHER PUBLICATIONS

Schneider, Florian, International Search Report of International Application No. PCT/EP2013/003665, date completed Apr. 1, 2014, date mailed Apr. 8, 2014, 6 pages, European Patent Office.
(Continued)

*Primary Examiner* — Fenn Mathew
*Assistant Examiner* — Elizabeth Volz
(74) *Attorney, Agent, or Firm* — King & Spalding LLP

(57) ABSTRACT

A box comprising a box bottom part and a lid part which is pivotably supported relative thereto by means of a hinge device between an open and a closed position is particularly suited for use in the Ex area. The hinge device comprises a lower hinge part assigned to the box bottom part and an upper hinge part assigned to the lid part, which are pivotably connected to each other. To provide a permanent connection between lid part and box bottom part in a simple way and at low costs, while simultaneously said parts are pivotable relative to each other in a safe way, one hinge part is slidably supported and the other hinge part is arranged to be at least partly screw-mountable in the respectively assigned box bottom part and lid part, respectively.

13 Claims, 2 Drawing Sheets

(51) Int. Cl.
  *E05D 7/04*  (2006.01)
  *E05D 5/02*  (2006.01)
  *H05K 5/02*  (2006.01)
  *H02B 1/38*  (2006.01)
  *H02B 1/40*  (2006.01)
  *E05F 1/12*  (2006.01)
  *E05D 5/12*  (2006.01)
  *E05D 3/02*  (2006.01)

(52) U.S. Cl.
  CPC ............... *E05D 3/022* (2013.01); *E05D 5/12* (2013.01); *E05F 1/12* (2013.01); *E05Y 2900/602* (2013.01); *H02B 1/38* (2013.01); *H02B 1/40* (2013.01); *Y10T 16/5323* (2015.01); *Y10T 16/5329* (2015.01); *Y10T 16/545* (2015.01)

(58) Field of Classification Search
  CPC ............. Y10T 16/5329; Y10T 16/5323; Y10T 16/545; H02B 1/38; H02B 1/40; E05F 1/12
  USPC ............... 220/3.7, 3.8, 836; 16/249
  See application file for complete search history.

(56) References Cited

FOREIGN PATENT DOCUMENTS

| | | |
|---|---|---|
| DE | 3542989 | 6/1987 |
| DE | 3543989 | 6/1987 |
| DE | 19623084 | 10/1997 |
| DE | 102006052723 | 5/2008 |
| FR | 2814321 | 3/2002 |
| GB | 2187228 | 9/1987 |

OTHER PUBLICATIONS

Office Action issued in Japanese patent application No. 2015-545693, mailing date Apr. 26, 2016, 5 total number of a pages including translation of office action, Japanese Patent Office.
Machine Translation of DE 3543989, via LexisNexis Total Patents, 6 pages.
Machine Translation of DE 102006052723, via LexisNexis Total Patents, 10 pages.
Machine Translation of CH 417727, via LexisNexis Total Patents, 2 pages.
Machine Translation of DE 546291, via LexisNexis Total Patents, 2 pages.

\* cited by examiner

BOX COMPRISING A HINGE DEVICE

PRIORITY CLAIM

The present application is a national phase of and claims priority to International Application No. PCT/EP2013/003665 with an International filing date of Dec. 4, 2013 and which claims priority to German patent application no. 102012023991.2 filed Dec. 6, 2012. The foregoing applications are hereby incorporated herein by reference.

TECHNICAL FIELD

The present invention refers to a box, particularly for use in the Ex area.

BACKGROUND

Such a box serves for instance to accommodate terminals, switches, connectors, or the like, which are used in the Ex area. Moreover, other electric and electronic devices can be arranged in the box. If such a lid part is fully detachable from the box bottom part, there is the risk that a wrong lid part is placed on a box bottom part or that the lid part gets possibly lost.

It is the object of the present invention to improve a box of the aforementioned type so as to provide a permanent connection between lid part and box bottom part in a simple way and at low costs, while simultaneously said parts are pivotable relative to each other in a safe way.

SUMMARY

This object is achieved by the features of patent claim 1.

In particular, one hinge part is slidably supported and the other hinge part is arranged to be at least partly screw-mountable in the respectively assigned box bottom part and lid part, respectively. Owing to the pivotable support of the two hinge parts with each other, these are not separable as a rule. At the same time one hinge part is slidably supported in one part of the box for opening and closing the lid part in a simplified way while the other hinge part is screwed with the respectively other part of the box. Owing to this slidability the lid part is lifted and lowered to a certain extent, depending on pivoting into the open or closed position. At the same time the corresponding slidable hinge part should also be arranged in the corresponding part of the box such that it cannot easily be detached therefrom.

A corresponding slidability is e.g. simply provided when the lower hinge part is possibly configured as a displacement bolt with a rim flange which is at least partly surrounding a flange end, with the upper hinge part being pivotably supported on a bearing end opposite to the flange end. With the rim flange it is prevented that the lower hinge part is removable or detachable for instance from the box bottom part. The lower hinge part can only be detached from the box bottom part after the upper hinge part, which is here designed for screwing purposes, has been screwed out.

To permit an easy displaceability and optionally also rotatability, the displacement bolt may have a substantially circular cross-section and a smooth outside.

To prevent rotatability of the hinge device in one embodiment, the rim flange may have an oval, cornered or other non-circular cross-section which substantially corresponds to a cross section of a rim flange recess in the box bottom part. This means that when the lid part is in the closed position, the rim flange is arranged with its corresponding cross-section in the geometrically similar cross-section of the rim flange recess and is there held in particular in a non-rotatable manner.

In a simple embodiment the rim flange recess may be directly formed on one end of a displacement bolt bore in an edge portion of the box bottom part.

To be able to open the lid part to a sufficiently wide degree and to arrange it possibly in the open position without holding it tight, a pivot range from the upper hinge part to the lower hinge part may be greater than 90°, preferably 180°, and particularly preferably up to 220°.

The upper hinge part can be screwed easily when the upper hinge part comprises a screw-in bolt at least on its screw-in end section opposite to the pivot end section which is pivotably connected to the lower hinge part.

An easy pivotability may be achieved between lower and upper hinge part when the bearing end of the lower hinge part comprises two bearing projections spaced apart from each other by a bearing gap, between which a bearing shaft is arranged for pivoting the upper hinge part. The upper hinge part is particularly supported on said bearing shaft with its pivot end section.

To achieve a sufficiently stable hinge device which can nevertheless e.g. be removed through the corresponding shift bolt bore, a diameter of the upper hinge part is smaller or not more than a diameter of the lower hinge part.

To be able to shift also the upper hinge device possibly into the shift bolt bore, the upper hinge part may comprise a middle, substantially cylindrical, mid-section from which the screw-in end section as a screw-in bolt provided with external thread as well as the pivot end section are projecting.

In a further embodiment it is moreover possible that substantially the whole upper hinge part is configured as a screw-in bolt which at one side comprises the corresponding pivot end section.

To define a specific screw-in position of the hinge device when the upper hinge part is screwed in, a screw-in stop may e.g. be formed between mid-section and screw-in bolt. This means that the upper hinge part is screwed into the lid part to such an extent that the screw-in stop abuts thereon or in a corresponding recess of the lid part.

A simple arrangement of the hinge device may consist in that the hinge device can be arranged on substantially two box corners. This means that these corresponding box corners have formed therein two shift bolt bores in which a respective lower hinge part is displaceably arranged. The upper hinge part projects towards the lid part and is screwed therewith via the screw-in bolt.

The invention also refers to a corresponding hinge device as has been described above, i.e. with lower and upper hinge parts that are pivotably connected to each other, wherein one hinge part is configured to be slidable and the other hinge part is configured to be at least screw-mountable. The remaining features of the hinge device become apparent from the preceding description.

BRIEF DESCRIPTION OF THE DRAWINGS

Advantageous embodiments of the invention shall now be explained with reference to the figures enclosed in the drawing, of which.

DETAILED DESCRIPTION OF THE EXAMPLE EMBODIMENTS

Figure 1:
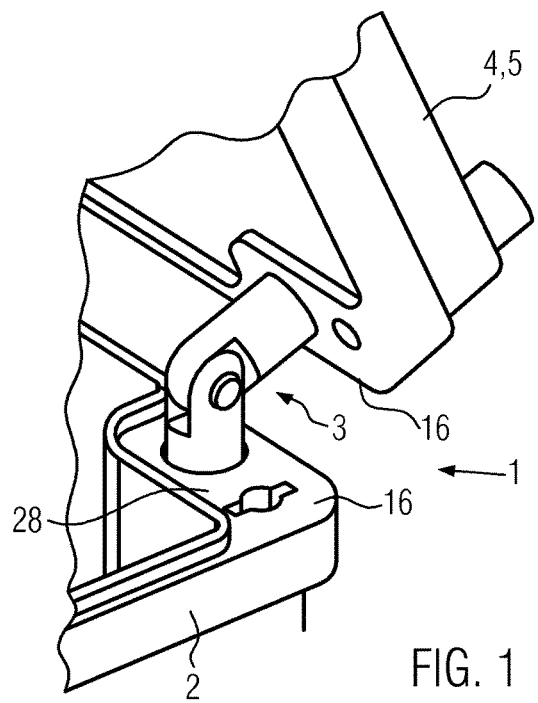
FIG. 1 is a partial view of a box with hinge device according to the invention.

FIG. 1 shows a partial representation of a corner portion of a box 1 according to the invention with a hinge device 3 arranged between box bottom part 2 and lid part 4. The lid part 4 is shown in a partly open position 5, with a corresponding pivot range 17, see also FIG. 3, being substantially 180° between open position and closed position.

The box bottom part 2 has an interior in which electric or electronic devices can be disposed. These are not shown in the figures.

Figure 2:
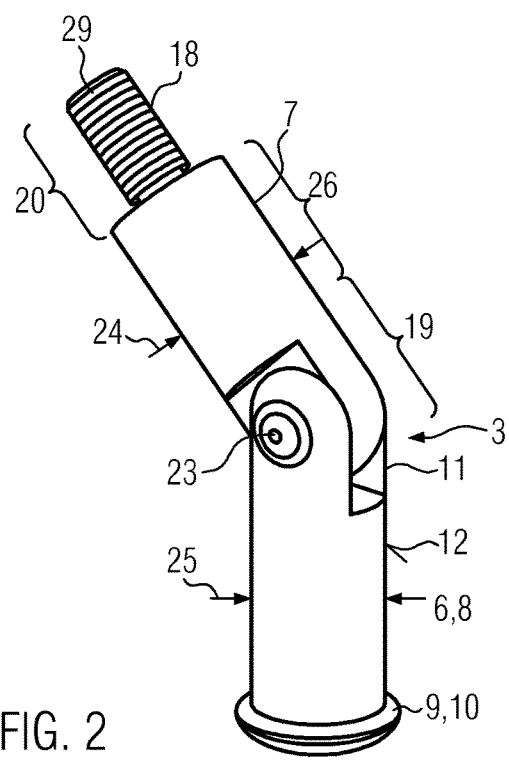
FIG. 2 shows the hinge device according to FIG. 1 alone.

The hinge device 3 comprises a lower hinge part 6, see also FIG. 2, and an upper hinge part 7. These are pivotally interconnected at ends assigned to one another. FIG. 2 shows the hinge device 3 without box 1.

The upper hinge part 7 has a substantially cylindrical mid-section 26. This section has a diameter 24 which substantially corresponds to or is smaller than a diameter 25 of the lower hinge part 6. The mid-section 26 is provided at an end facing the lid part 4, see also FIG. 1, with a screw-in end section 20 which is formed by a screw-in bolt 18 provided with external thread 29. A screw-in stop 27 is formed between screw-in bolt 18 and the mid-section 26, see also FIG. 3.

The mid-section 26 comprises a pivot end section 19 at its other end opposite to the screw-in end section 20. Said pivot end section is substantially formed by a bearing bracket with central bearing bore. The bearing shaft 23 is passed through said central bearing bore. The pivot end section 19 is arranged in a bearing gap 21 which is formed between two spaced-apart bearing projections 22 at a bearing end 11 of the lower hinge part 6. The bearing shaft 23 extends between said two bearing projections 22.

Subsequent to the bearing end 11, the lower hinge part 6 comprises a displacement bolt 8 with a substantially smooth outside 12. The cross section of the displacement bolt 8 is circular. At its flange end 9 opposite to the bearing end the lower hinge part 6 comprises a radially outwardly projecting rim flange 10. This flange is a fully surrounding flange, but partially surrounding rim flanges 10 are also possible.

Figure 3:
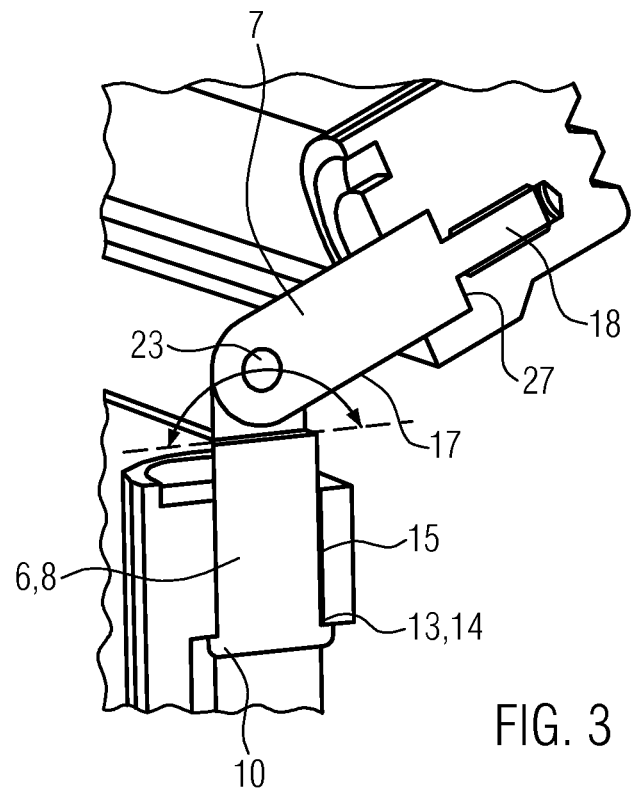
FIG. 3 is a longitudinal section through the hinge device according to FIG. 1.

According to FIG. 3 the displacement bolt 8 is displaceably supported in a corresponding displacement bolt bore 15 in the box bottom part 2. The displacement bolt bore 15 is positioned in an edge portion 16 of the box bottom part near a corner, see also FIG. 1. This applies by analogy to a screw-in bore in the lid part 4, see FIGS. 1 and 3, and to the screw-in bolt 18 screwed into said screw-in bore. The screw-in depth of the screw-in bolt 18 is defined by abutment of the screw-in stop 27 on an end of the corresponding screw-in bore in the lid part 4, see FIG. 3.

The bottom hinge part 6 is displaceably supported in the displacement bolt bore 15, the position according to FIG. 3 being defined by abutment of the rim flange 10 on an end of the displacement bolt bore 15.

When the lid part 4 is closed, the lid part is placed on the box bottom part 2; in this closed position the displacement bolt 8 is displaced downwards in the displacement bolt bore 15 in FIG. 3, so that the upper hinge part 7 is at least partly arranged in the displacement bolt bore 15. In this closed position of lid part 4 and box bottom part 2 the lid part 4 can then be tightly screwed onto the box bottom part 2.

In the open position according to FIG. 1 and FIG. 3, respectively, the displacement bolt 8 is displaced in said figures upwards to such a degree within the displacement bolt bore 15, that the rim flange 10 abuts from below on the end of the displacement bolt bore 15.

It is thereby ensured that even in the open position of the lid part the lid part is still connected to the box bottom part and cannot for instance get lost or be replaced by a wrong lid part.

This yields a permanent and fixed connection between lid part and box bottom part which can e.g. only be disengaged by screwing the screw-in bolt 18 out of the corresponding screw-in bore in the lid part.

Figure 4:
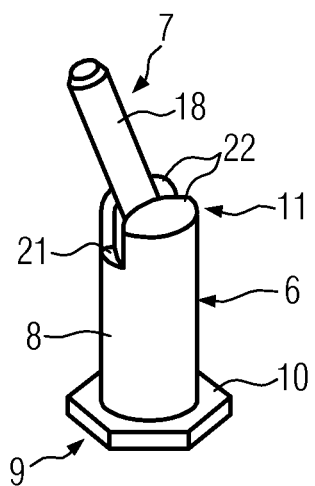
FIG. 4 is an illustration, by analogy with FIG. 2, of a further embodiment of a hinge device.

FIG. 4 shows a second embodiment of the hinge device 3. This device differs from the previously described one particularly in that the upper hinge part 7 is formed substantially completely by a screw-in bolt 18. Said bolt extends up to the pivot end section 19, which by analogy with FIG. 2 is accommodated and pivotably supported in a bearing gap 21 between bearing projections 22.

A further difference with respect to the previously described embodiment is that the rim flange 10 has a different cross-section. While the rim flange 10 according to FIG. 2 has a circular cross-section, the rim flange 10 according to FIG. 4 has a polygonal cross-section. Particular attention should here be paid that in an arrangement of the hinge device 3 according to FIG. 4, by analogy with FIG. 3, said polygonal rim flange 10 is accommodated in a correspondingly shaped rim flange recess 13 at the lower end of the displacement bolt 15. The rim flange recess 13 has a cross section matching the rim flange 10, so that in an arrangement analogous to FIG. 3 the flange is non-rotatably arranged in the rim flange recess 13.

The invention provides a box with hinge device or also a hinge device as such that serves to connect box bottom part and lid part and prevents a detachment of the lid part during opening. Instead, the hinge part creates a permanent connection between lid part and box bottom part. Owing to the corresponding displaceability of the lower hinge part in the box bottom part, this permits a simple opening of the lid part with a great opening angle through the corresponding pivot range between lower hinge part and upper hinge part.

The whole hinge device is arranged outside the opening range of the box bottom part, so that corresponding openings towards the interior of the box bottom part are avoided.

The invention claimed is:

1. A box (1) comprising a box bottom part (2) and a lid part (4) which is pivotably supported relative thereto by means of a hinge device (3) between an open and a closed position, the hinge device (3) comprising a lower hinge part (6, 7) assigned to the box bottom part (2) and an upper hinge part (6, 7) assigned to the lid part, which are pivotably connected to each other, characterized in that one hinge part (6, 7) is slidably supported and the other hinge part (7, 6) is arranged to be at least partly screw-mountable in the respectively assigned box bottom part (2) and lid part (4), respectively, wherein the lower hinge part (6) is configured as a displacement bolt (8) with a rim flange (10) which is at least partly surrounding a flange end (9), wherein the upper hinge part (7) is pivotably supported on a bearing end (11) opposite to the flange end (9), and wherein the rim flange (10) has an oval, cornered or other non-circular cross-section which substantially corresponds to a cross section of a rim flange recess (13) in the box bottom part (2).

2. The box according to claim 1, wherein the displacement bolt (8) has a substantially circular cross-section and a smooth outside (12).

3. The box according to claim 1, wherein the rim flange recess (13) is formed on one end (14) of a displacement bolt bore (15) in an edge portion (16) of the box bottom part (2).

4. The box according to claim 1, wherein a pivot range (17) from the upper hinge part (7) to the lower hinge part (6) is greater than 90°.

5. The box according to claim 1, wherein the upper hinge part (7) comprises a screw-in bolt (18) at least on a screw-in section (20) opposite to a pivot end section (19) which is pivotably connected to the lower hinge part (6).

6. The box according to claim 5, wherein the upper hinge part (7) comprises a middle, substantially cylindrical, mid-section (26) from which the screw-in end section (20) and the screw-in bolt (18) provided with external thread (29) as well as the pivot section (19) are projecting.

7. The box according to claim 1, wherein the bearing end (11) comprises two bearing projections (22) spaced apart from each other by a bearing gap (21), between which a bearing shaft (23) is arranged for pivoting the upper hinge part (7).

8. The box according to claim 1, wherein a diameter (24) of the upper hinge part (7) is smaller or not more than a diameter (25) of the lower hinge part (6).

9. The box according to claim 1, wherein the upper hinge part (7) is substantially configured as a screw-in bolt (18) with a pivot end section (19).

10. The box according to claim 6, wherein a screw-in stop (27) is formed between mid-section (26) and screw-in bolt (18).

11. The box according to claim 1, wherein the hinge device (3) is substantially arranged on two box corners (28).

12. The box according to claim 1, wherein the hinge device comprises a lower and upper hinge part (6, 7) which are pivotably connected to each other, wherein one hinge part (6, 7) is configured to be slidable and the other hinge part (7, 6) to be at least partly screw-mountable.

13. The box according to claim 1, wherein the hinge device has a pivot range (17) from the upper hinge part (7) to the lower hinge part (6) is from about 180° up to 220°.

* * * * *